(12) United States Patent
Matsuzaki

(10) Patent No.: US 7,371,672 B2
(45) Date of Patent: May 13, 2008

(54) SEMICONDUCTOR DEVICE AND METHOD OF MANUFACTURING THE SAME

(75) Inventor: Kenji Matsuzaki, Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 103 days.

(21) Appl. No.: 11/412,982

(22) Filed: Apr. 28, 2006

(65) Prior Publication Data
US 2006/0246662 A1    Nov. 2, 2006

(30) Foreign Application Priority Data
Apr. 28, 2005   (JP) .............................. 2005-132161

(51) Int. Cl.
*H01L 21/8247* (2006.01)
(52) U.S. Cl. ............................... 438/593; 257/E21.179
(58) Field of Classification Search ........ 438/257–267, 438/593–594; 257/E21.179
See application file for complete search history.

(56) References Cited

U.S. PATENT DOCUMENTS 4,490,900 A * 1/1985 Chiu ........................... 438/591

4,616,402 A * 10/1986 Mori ........................... 438/257

FOREIGN PATENT DOCUMENTS

JP          2003-78047          3/2003

* cited by examiner

*Primary Examiner*—Richard A. Booth
(74) *Attorney, Agent, or Firm*—Oblon, Spivak, McClelland, Maier & Neustadt, P.C.

(57) ABSTRACT

A method of manufacturing a semiconductor device includes removing a low-resistivity metal film, conductive layer, third insulating film and an upper part of the electrode layer in a gate electrode isolation region with a gate forming pattern serving as a mask, forming a protecting film so that the protecting film covers the low-resistivity metal film, conductive layer, third insulating film and upper surface of the electrode layer, removing the protecting film formed on the upper surface of the electrode layer located in the upper surface of the electrode layer in the gate electrode isolation region, removing the electrode layer in the gate electrode isolation region, and removing residue of the protecting film.

4 Claims, 15 Drawing Sheets

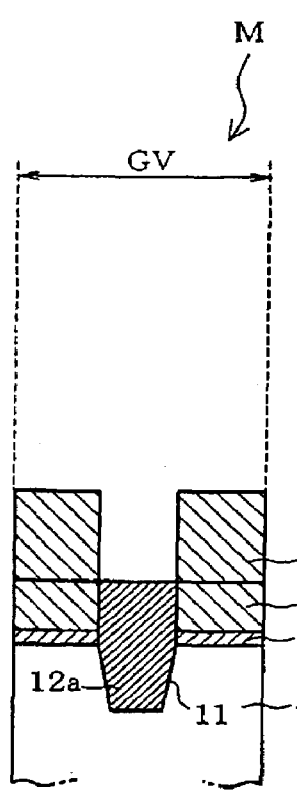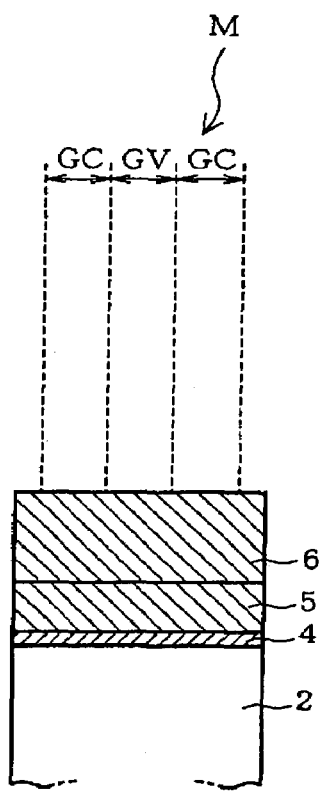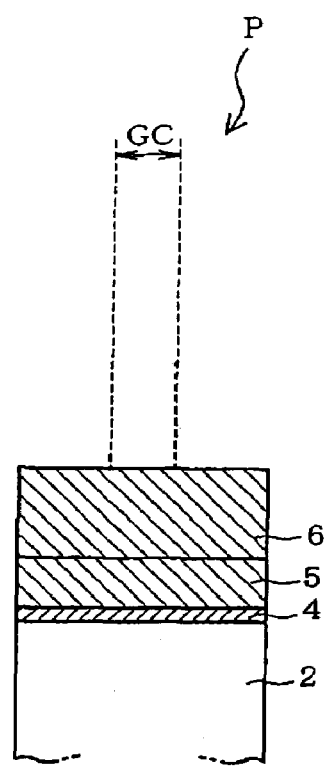
FIG. 5A  FIG. 5B  FIG. 5C
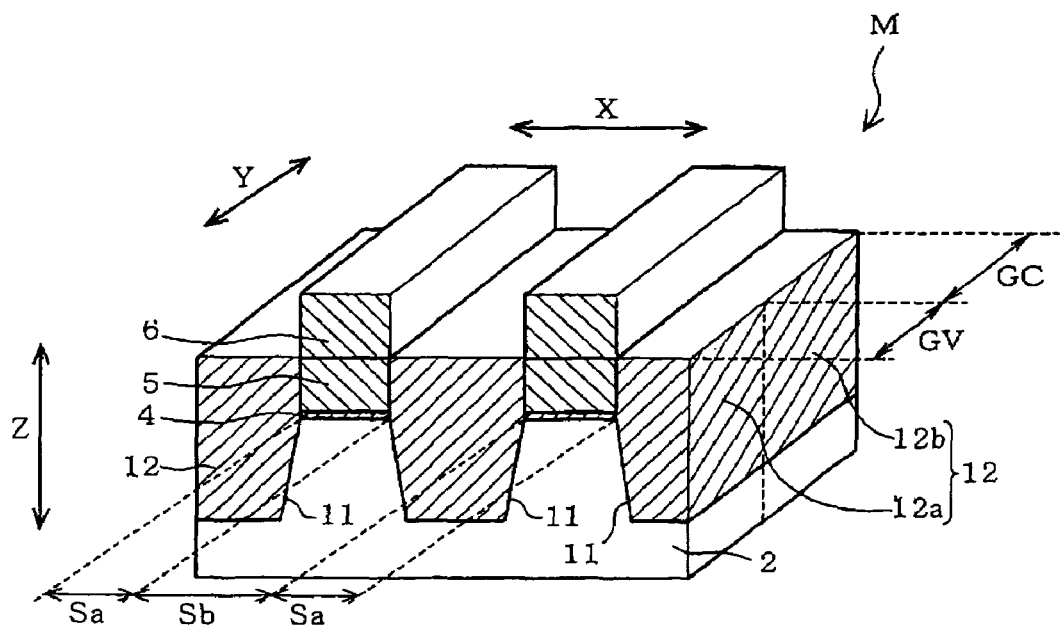
FIG. 5D

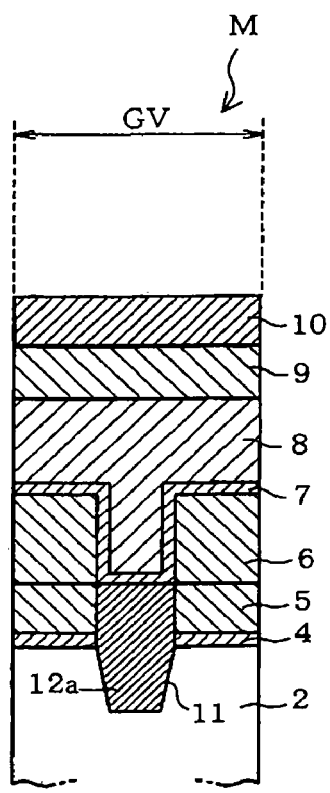 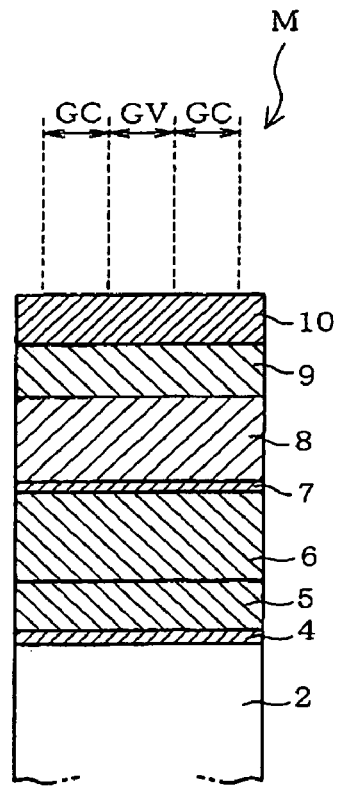 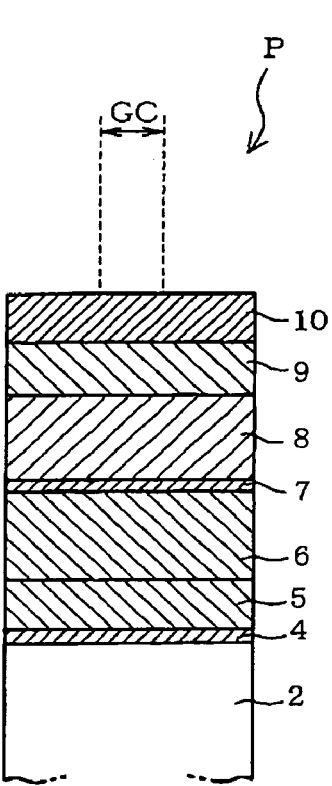
FIG. 6A  FIG. 6B  FIG. 6C
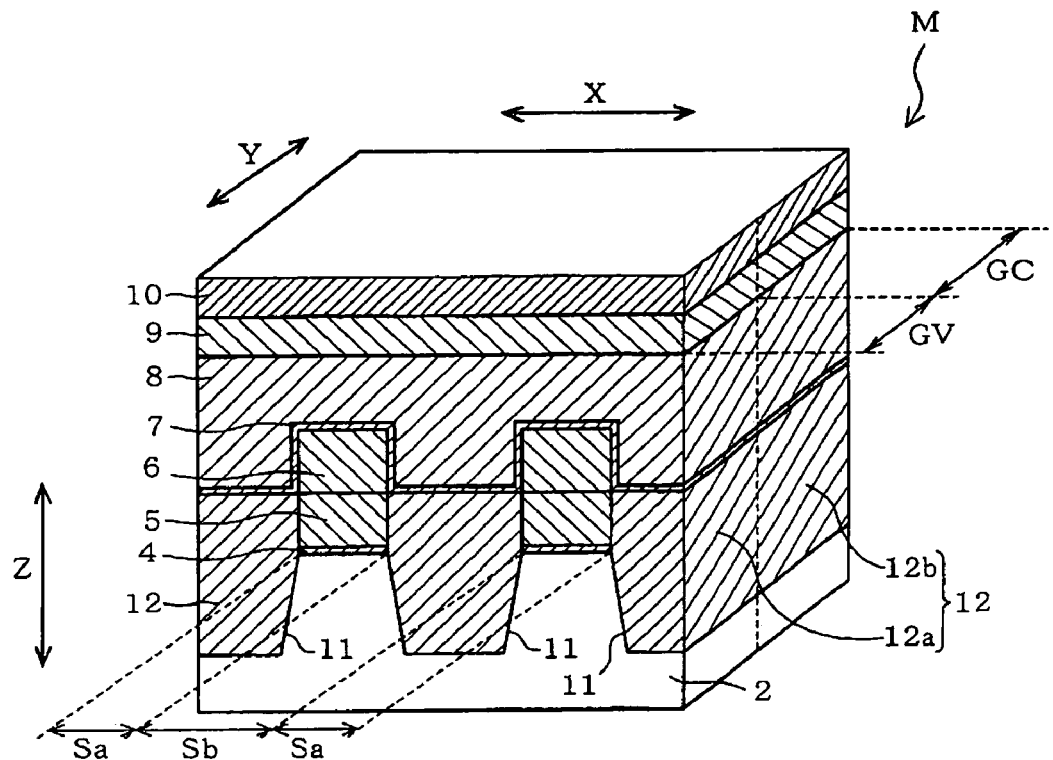
FIG. 6D

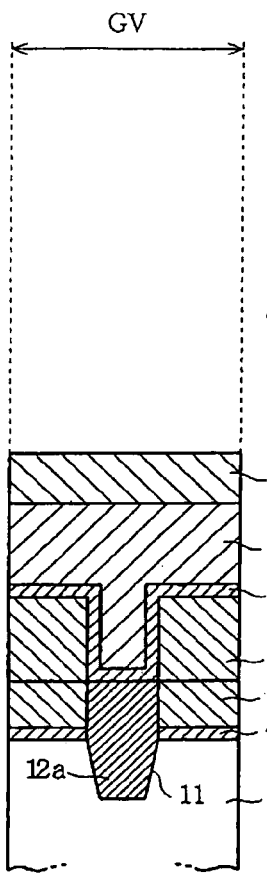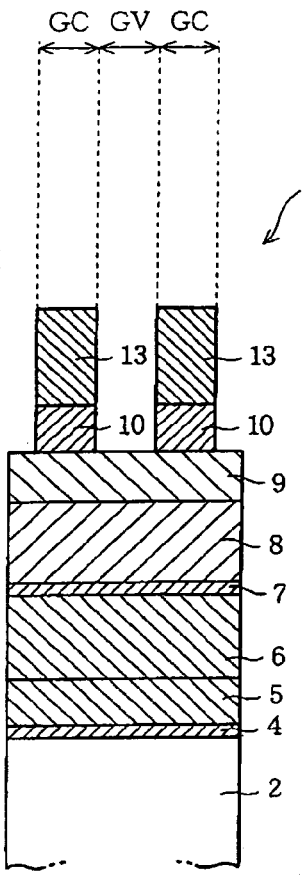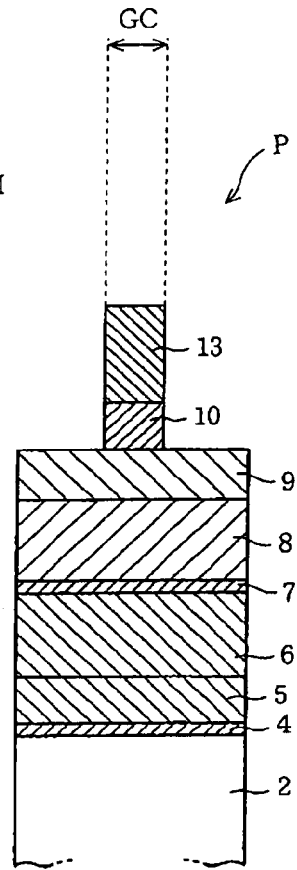
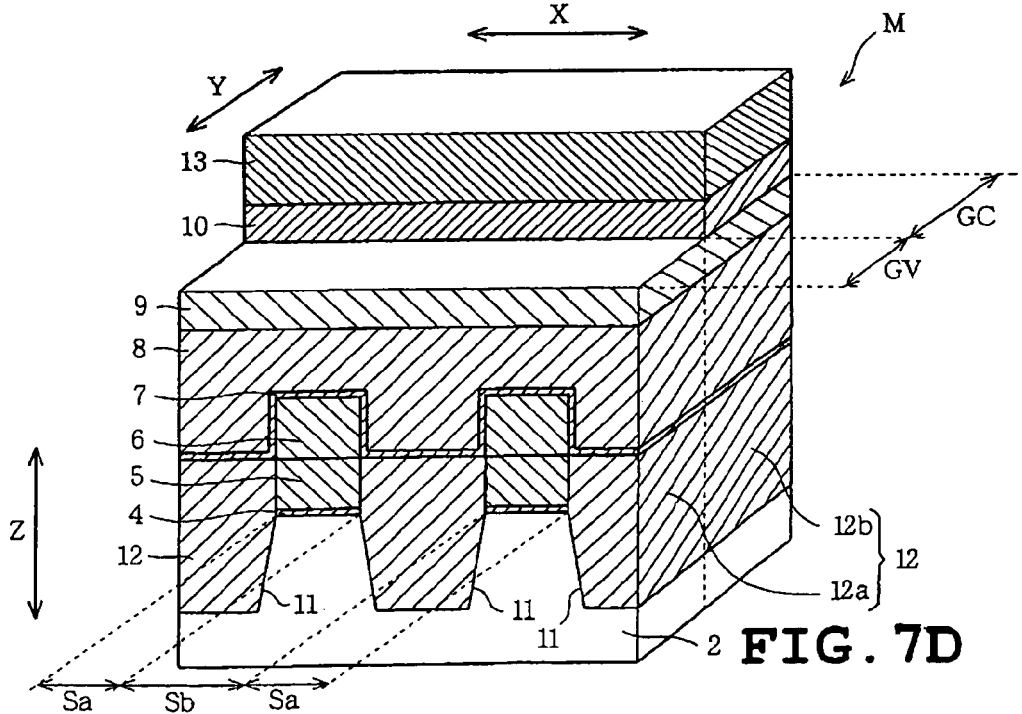

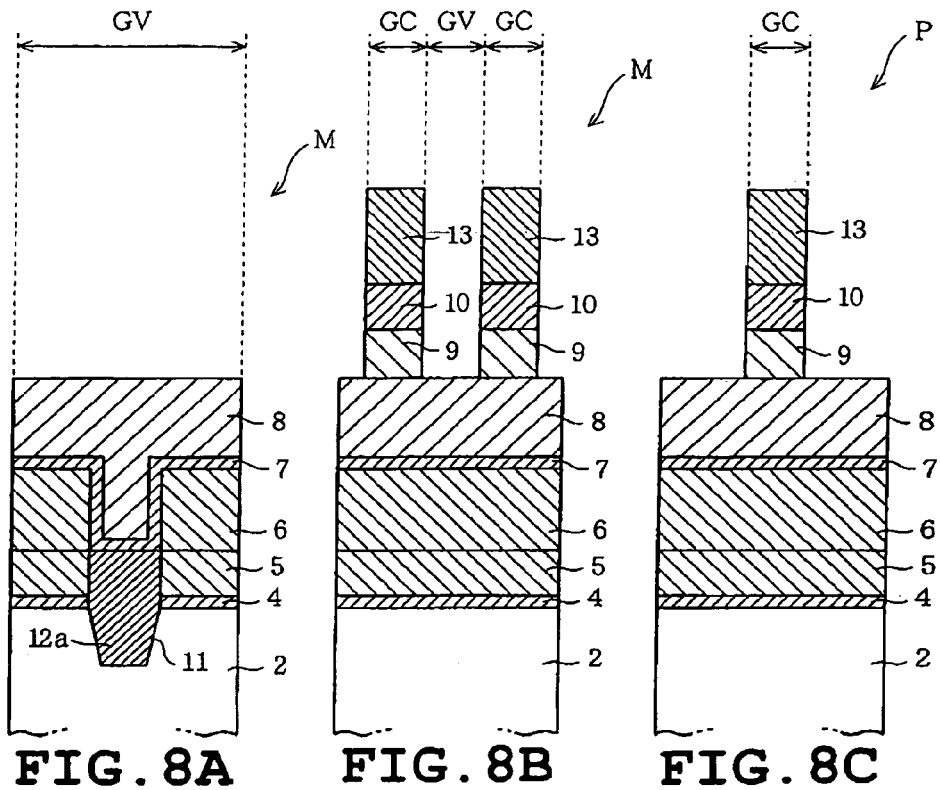
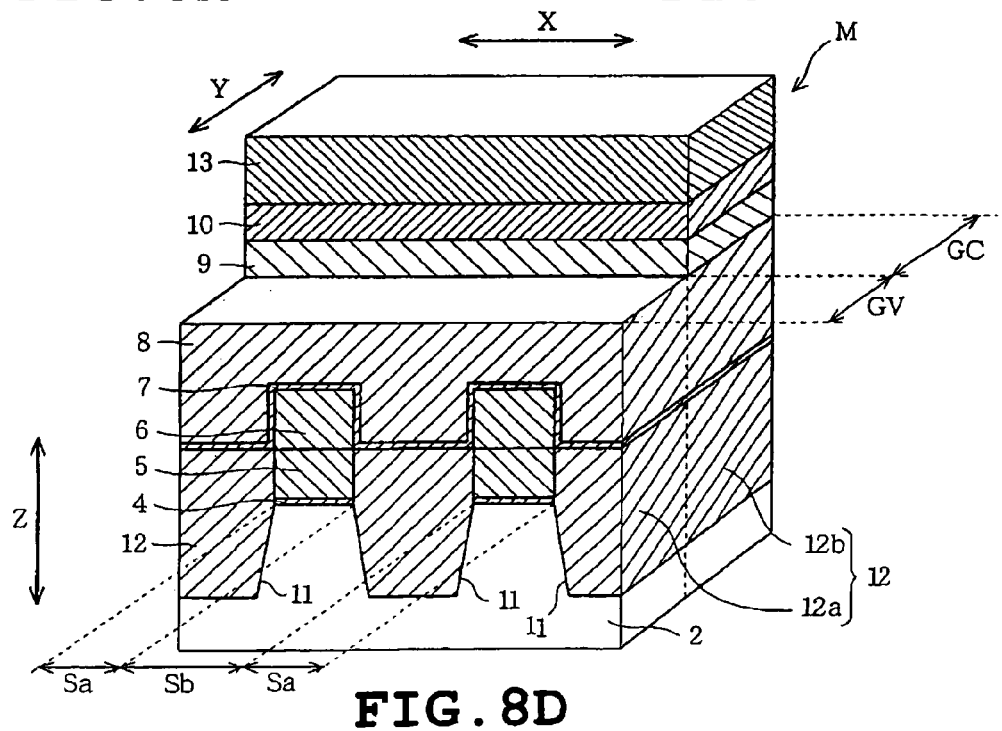

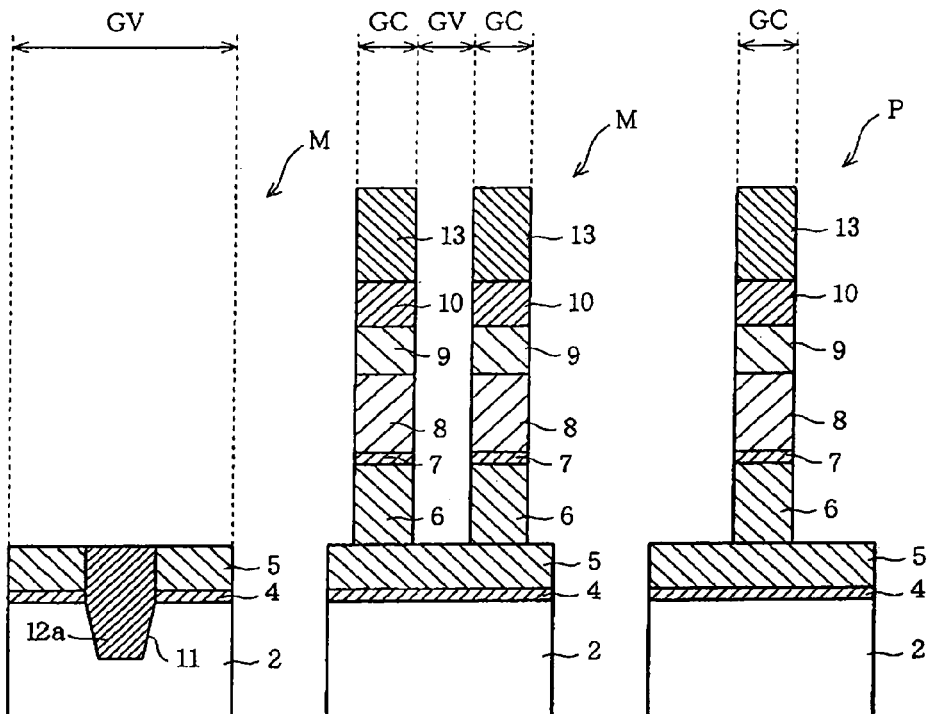
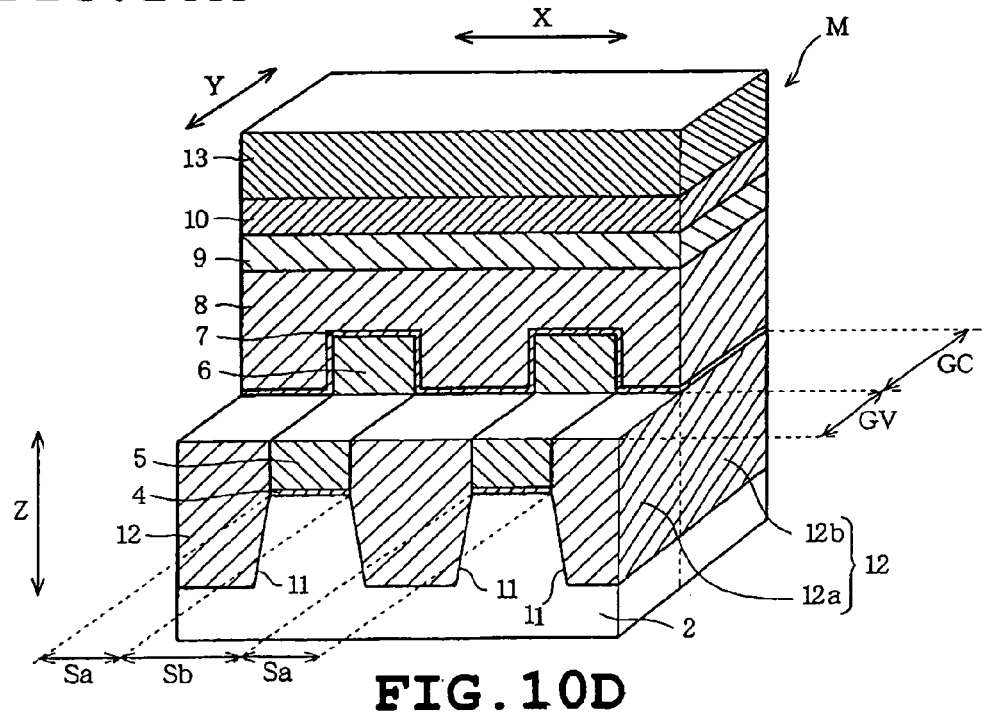
FIG. 10A   FIG. 10B   FIG. 10C
FIG. 10D

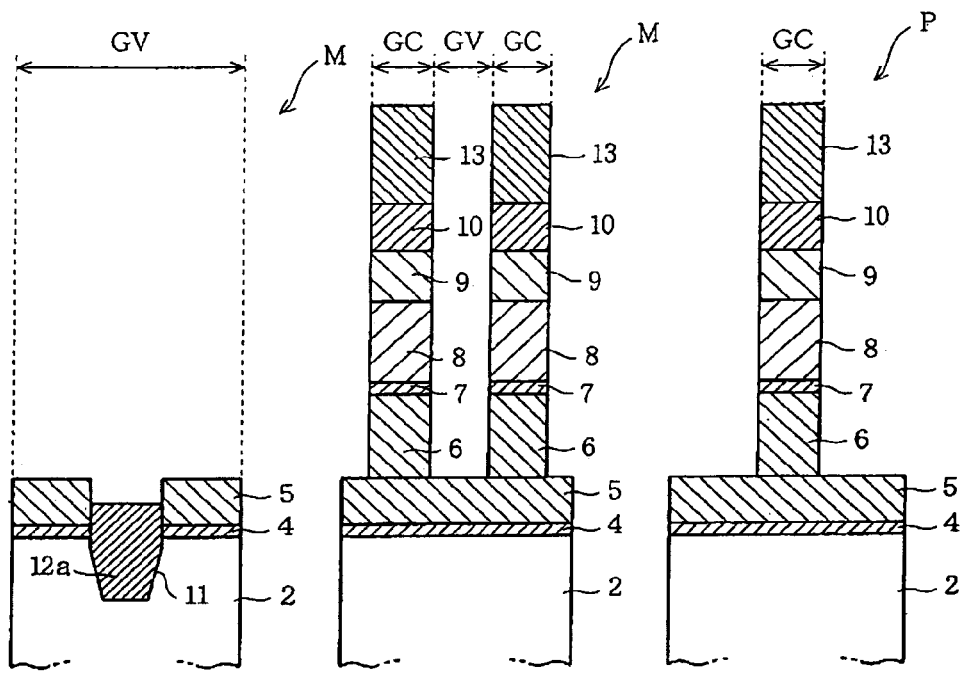
FIG.11A   FIG.11B   FIG.11C
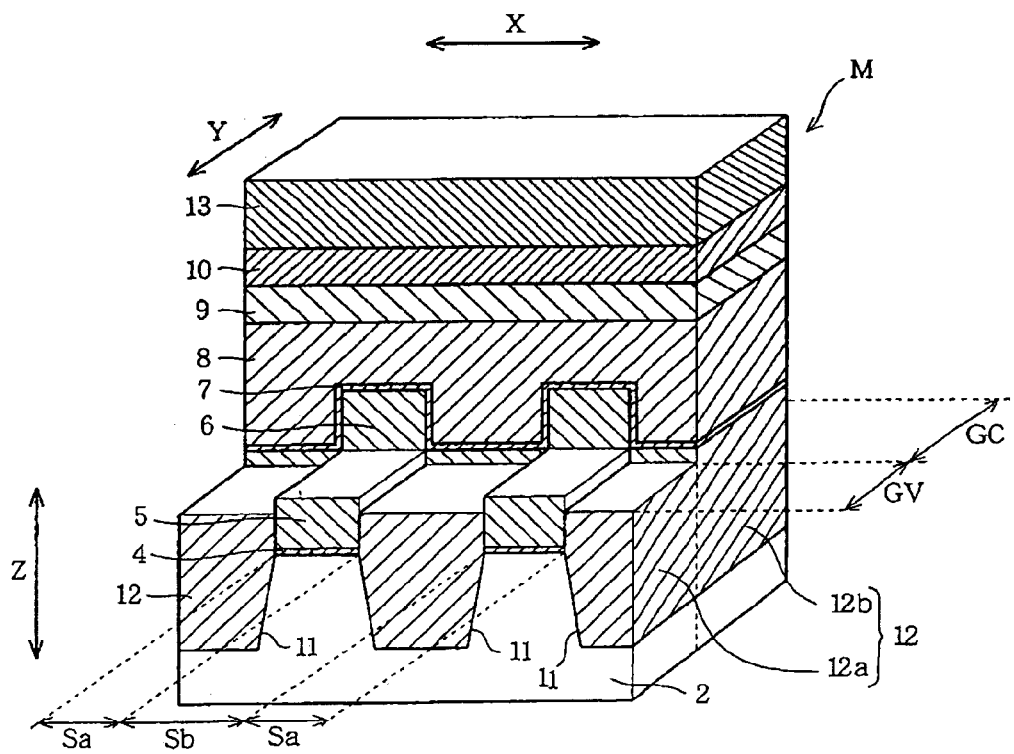
FIG.11D

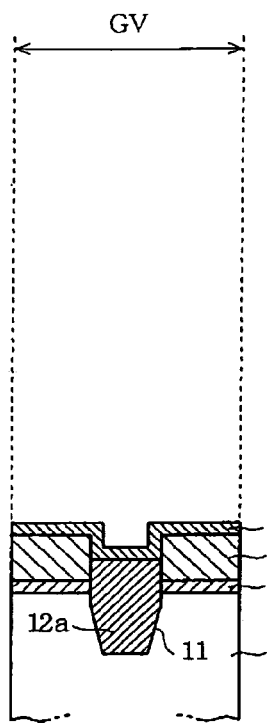
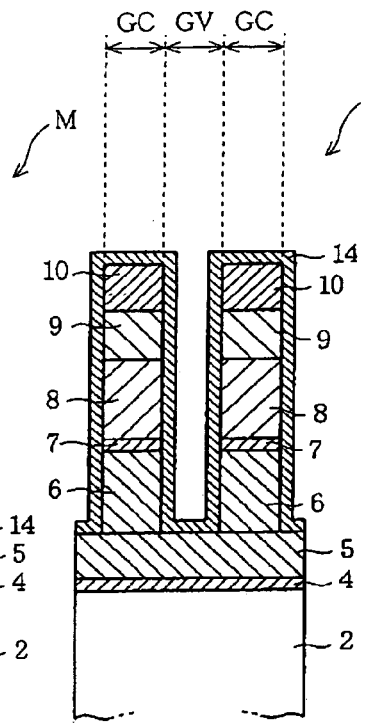
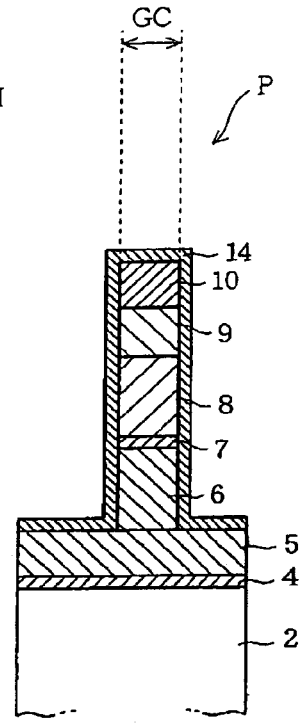
FIG.12A  FIG.12B  FIG.12C
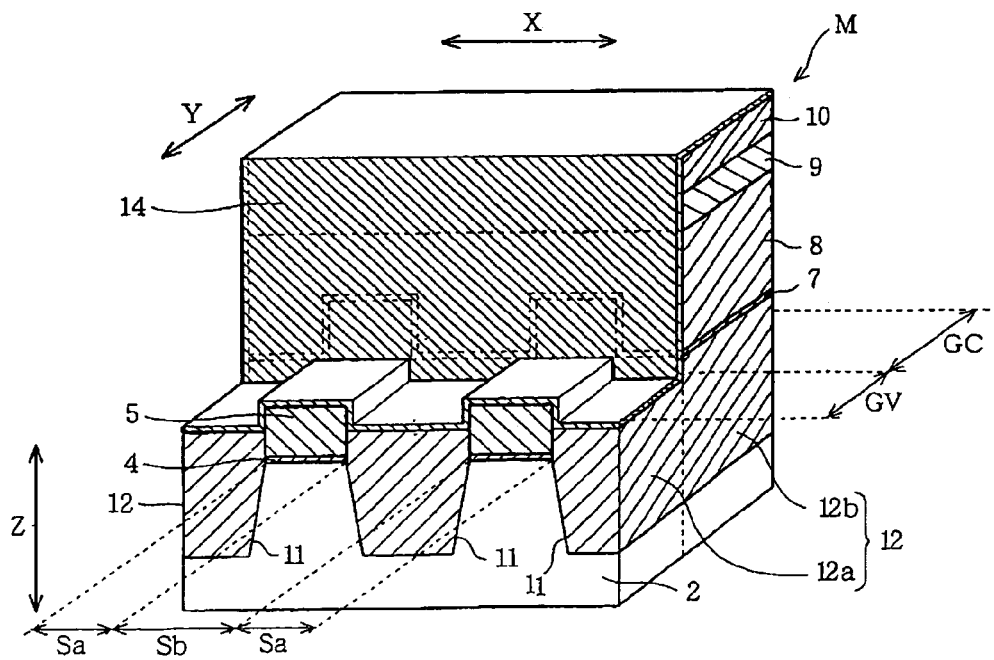
FIG.12D

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2005-132161, filed on Apr. 28, 2005, the entire contents of which are incorporated herein by reference.

BACKGROUND OF THE INVENTION

1. Field of the Invention

The present invention relates to a semiconductor device with a structure that element isolation regions are formed so as to be self-aligned with gate electrodes and a method of manufacturing the same.

2. Description of the Related Art

With recent reduction in the design rules, semiconductor devices have employed a structure that element isolation regions are formed so as to be self-aligned with gate electrodes. As one of such semiconductors, JP-A-2003-78047 discloses a NAND flash memory. The disclosed NAND flash memory is manufactured as follows. A first insulating film serving as a gate insulating film is formed on a principal surface of a semiconductor substrate. A first electrode layer (corresponding to an electrode layer) serving as a floating gate electrode is formed on the first insulating film. Subsequently, the first electrode layer, first insulating film and a flat part of the semiconductor substrate are selectively removed so that element isolation trenches are formed. Next, an insulating film (corresponding to a second insulating film) is buried in the element isolation trenches so that element isolation insulating films are formed, respectively. The element isolation insulating film is etched until a part of the element isolation insulating film is located at a level between the first electrode layer and the first insulating film. Subsequently, a second insulating film (corresponding to a third insulating film) is formed as an interpoly insulating film so as to cover the whole first electrode layer and the whole element isolation insulating film.

Subsequently, a second electrode layer (corresponding to a conductive layer and a low resistivity metal film) is formed on the second insulating film. A gate processing pattern is formed on the second electrode layer. The second electrode layer, the second insulating film and the first electrode layer are removed with the gate processing pattern serving as a mask. In this case, since an upper part of the insulating film formed in the element isolation region has previously been etched so as to be nearly at the level of an upper surface of the first insulating film, etching residue can be suppressed with respect to the first electrode layer on the sidewalls of the second insulating film, occurrence of short circuit can be suppressed between gate electrodes.

In the above-described method, however, sidewalls of the first and second electrode layers are exposed when the upper part of the second insulating film is etched so as to be nearly at the level of an upper surface of the first insulating film. Accordingly, there is a possibility that electrical characteristics of the first and second electrode layers may be deteriorated. In particular, the possibility of deterioration becomes higher when these electrode layers contain a low resistivity metal film.

BRIEF SUMMARY OF THE INVENTION

Therefore, an object of the present invention is to provide a semiconductor device which can suppress deterioration of electrical characteristics and a method of manufacturing the same.

In one aspect, the present invention provides a method of manufacturing a semiconductor device, comprising forming a first insulating film on a semiconductor substrate, forming an electrode layer on the first insulating film, forming a second insulating film on the semiconductor substrate so that the second insulating film extends in a predetermined direction, forming a third insulating film, a conductive layer and a low-resistivity metal film sequentially so that the second insulating film and the electrode layer are covered by the third insulating film, the conductive layer and the low-resistivity metal film, forming a gate forming pattern on the low-resistivity metal film so that the gate forming pattern corresponds to a plurality of gate electrode formation regions extending in a direction perpendicular to a predetermined direction on the principal surface of the semiconductor substrate, removing the low-resistivity metal film, the conductive layer, the third insulating film and an upper part of the electrode layer in a gate electrode isolation region interposed between the neighboring gate electrode formation regions with the gate forming pattern serving as a mask, forming a protecting film so that the protecting film covers the low-resistivity metal film, the conductive layer, the third insulating film and an upper surface of the electrode layer all exposed as a result of execution of the removing step, removing the protecting film formed on the upper surface of the electrode layer located on the upper surface of the electrode layer on the gate electrode isolation region, removing the electrode layer on the gate electrode isolation region, the electrode layer being exposed as a result of execution of the protecting film removing step, and removing residue of the protecting film.

In another aspect, the invention provides a semiconductor device comprising a semiconductor substrate, an electrode layer formed on the semiconductor substrate with a gate insulating film being interposed therebetween, an insulating film formed on the electrode layer, and a conductive layer formed on the insulating film, wherein the insulating film and the conductive layer have co-planar side faces respectively such that the insulating film and the conductive layer have respective predetermined widths which are equal to each other, and the electrode layer includes at least a part having a smaller width than the predetermined width.

BRIEF DESCRIPTION OF THE DRAWINGS

Other objects, features and advantages of the present invention will become clear upon reviewing the following description of the embodiment with reference to the accompanying drawings, in which:

FIGS. 5A to 5D are views similar to FIGS. 4A to 4D, showing a second step of the manufacturing process;

FIGS. 6A to 6D are views similar to FIGS. 4A to 4D, showing a third step of the manufacturing process;

FIGS. 7A to 7D are views similar to FIGS. 4A to 4D, showing a fourth step of the manufacturing process;

FIGS. 8A to 8D are views similar to FIGS. 4A to 4D, showing a fifth step of the manufacturing process;

FIGS. 10A to 10D are views similar to FIGS. 4A to 4D, showing a seventh step of the manufacturing process;

FIGS. 11A to 11D are views similar to FIGS. 4A to 4D, showing an eighth step of the manufacturing process;

FIGS. 12A to 12D are views similar to FIGS. 4A to 4D, showing a ninth step of the manufacturing process;

DETAILED DESCRIPTION OF THE INVENTION

One embodiment of the present invention will be described with reference to the accompanying drawings. The invention is applied to a NAND flash memory in the embodiment.

Figure 3A:
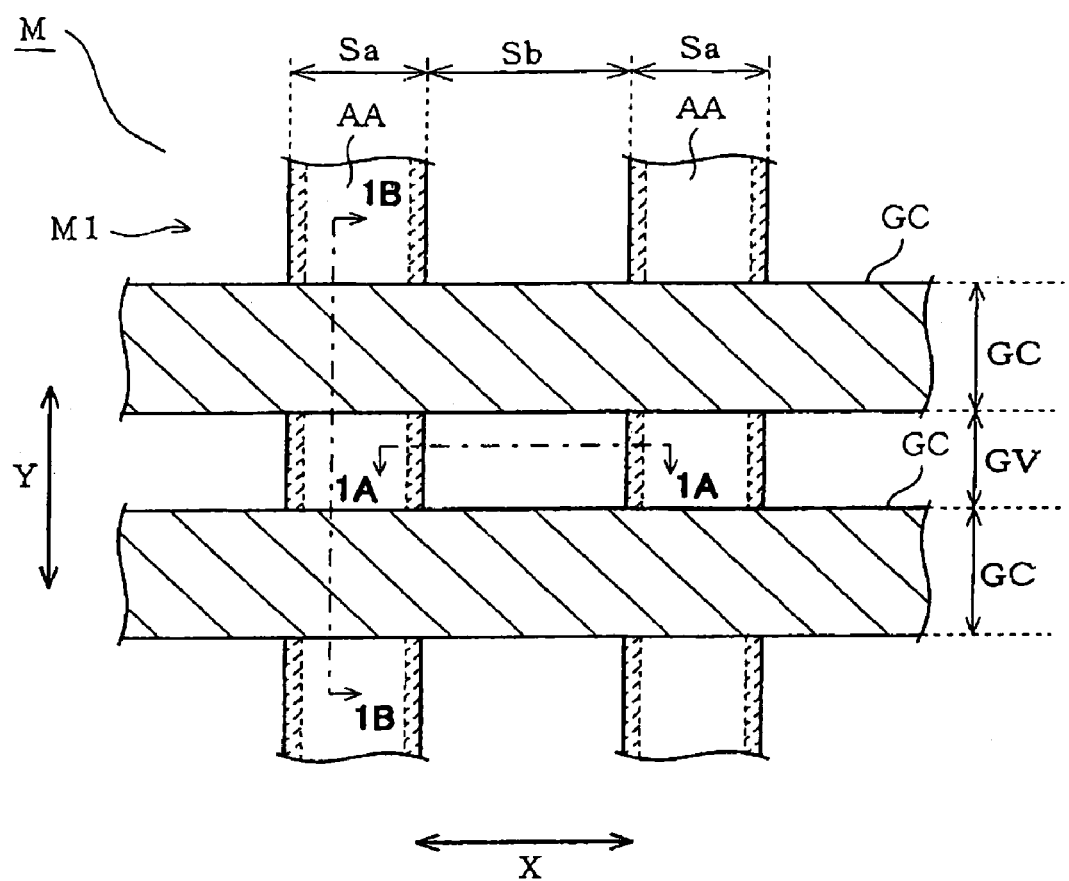
FIG. 3A is a schematic plan view of a part of the memory cell region.
Figure 3B:
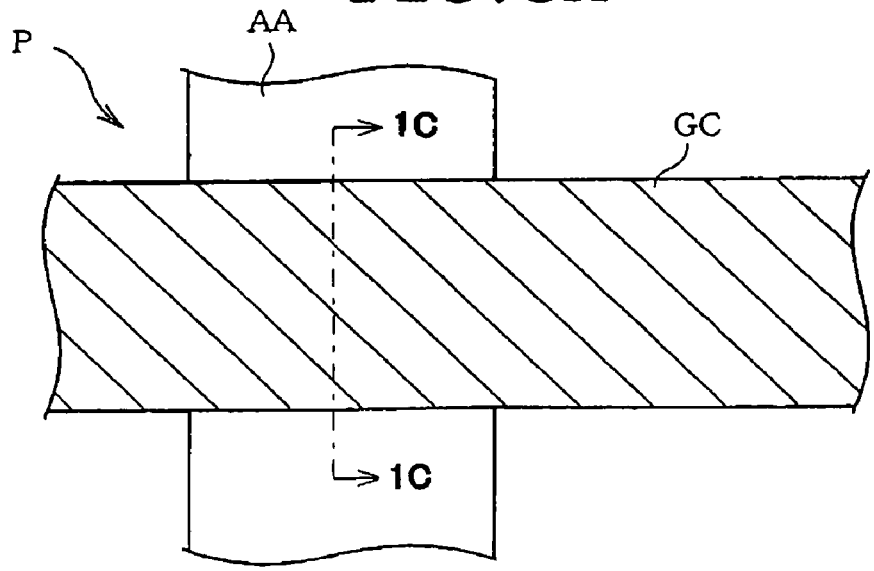
FIG. 3B is a schematic plan view of a part of the peripheral circuit region.
Figures 4A, 4B, 4C:
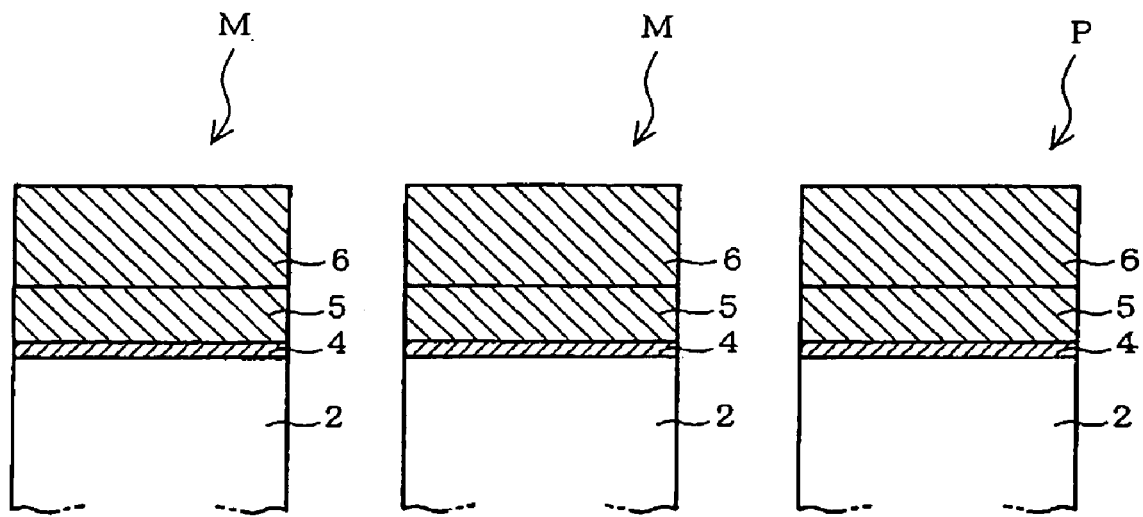
FIG. 4A is a schematic sectional view taken along line 1A-1A in FIG. 3A in a first step of the manufacturing process.
FIG. 4B is a schematic sectional view taken along line 1B-1B in FIG. 3A in the first step of the manufacturing process.
FIG. 4C is a schematic sectional view taken along line 1C-LC in FIG. 3B in the first step of the manufacturing process.
Figure 4D:
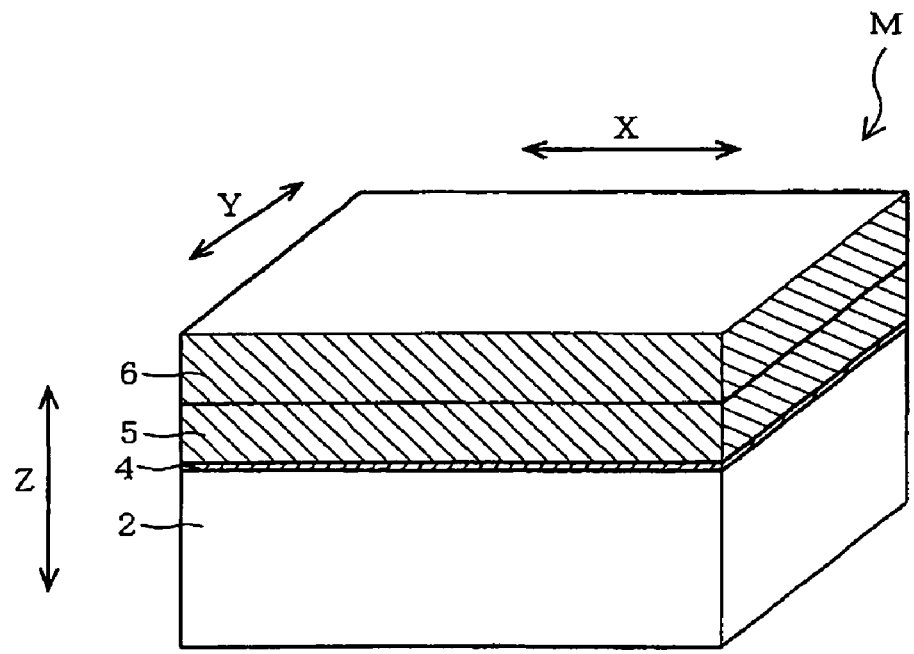
FIG. 4D is a schematic perspective view of a gate electrode formation region and a gate electrode isolation region in the first step of the manufacturing step.
Figures 9A, 9B, 9C:
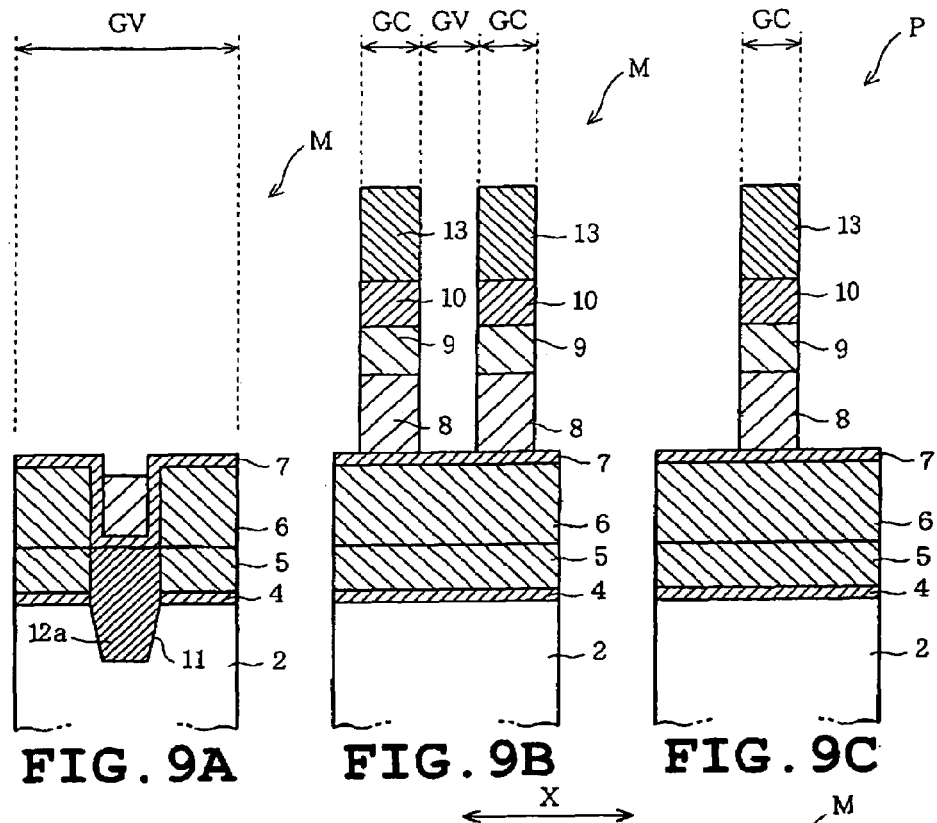
FIGS. 9A to 9D are views similar to FIGS. 4A to 4D, showing a sixth step of the manufacturing process.
Figure 9D:
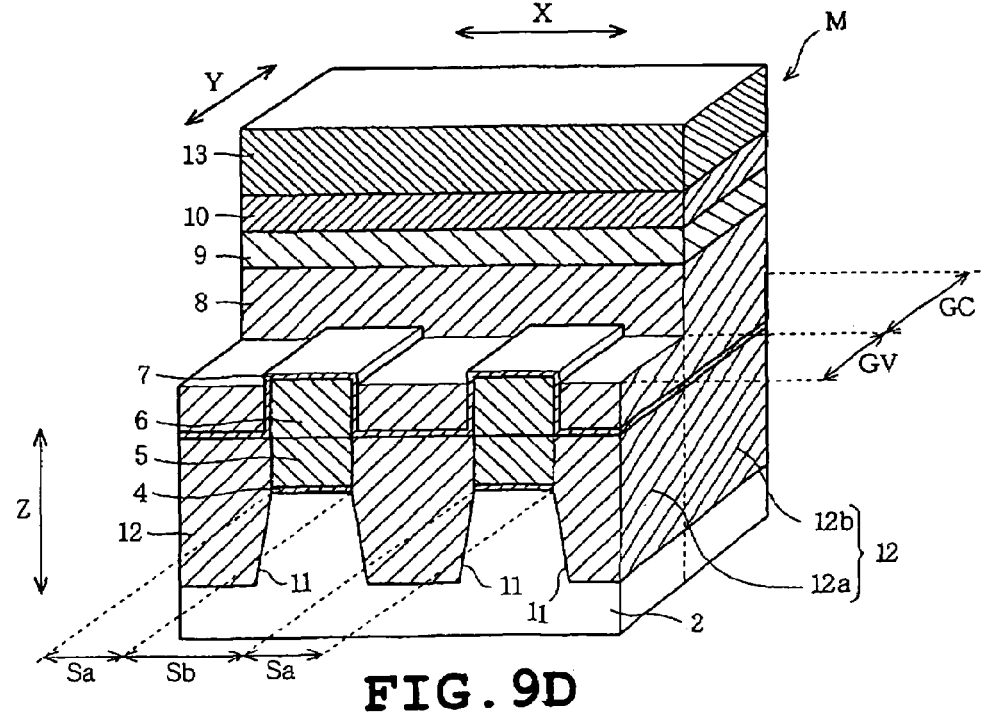
Figures 13A, 13B, 13C:
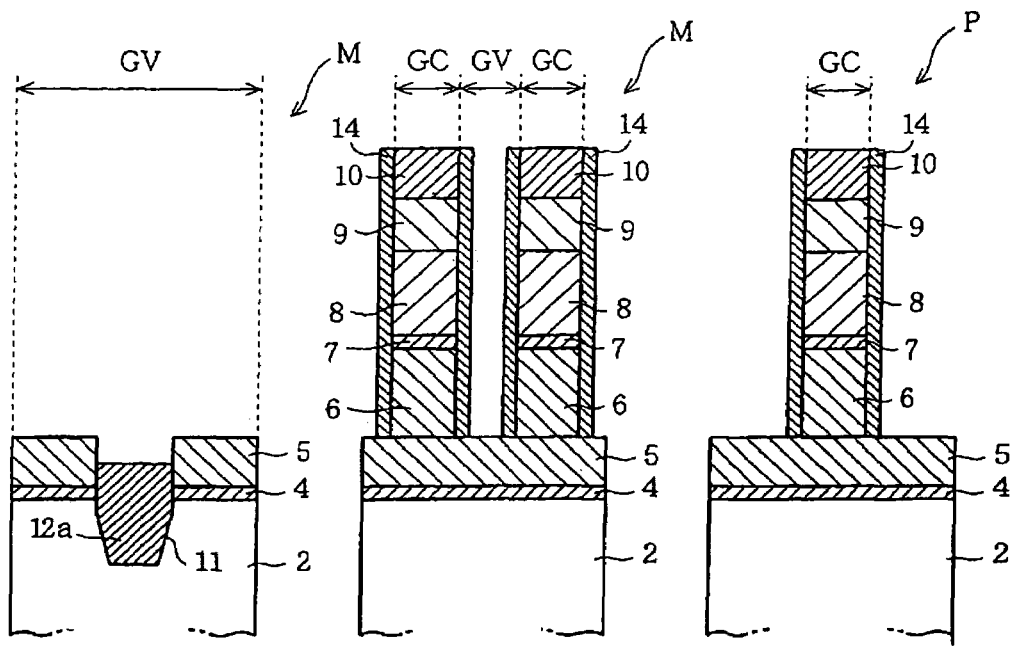
FIGS. 13A to 13D are views similar to FIGS. 4A to 4D, showing a tenth step of the manufacturing process.
Figure 13D:
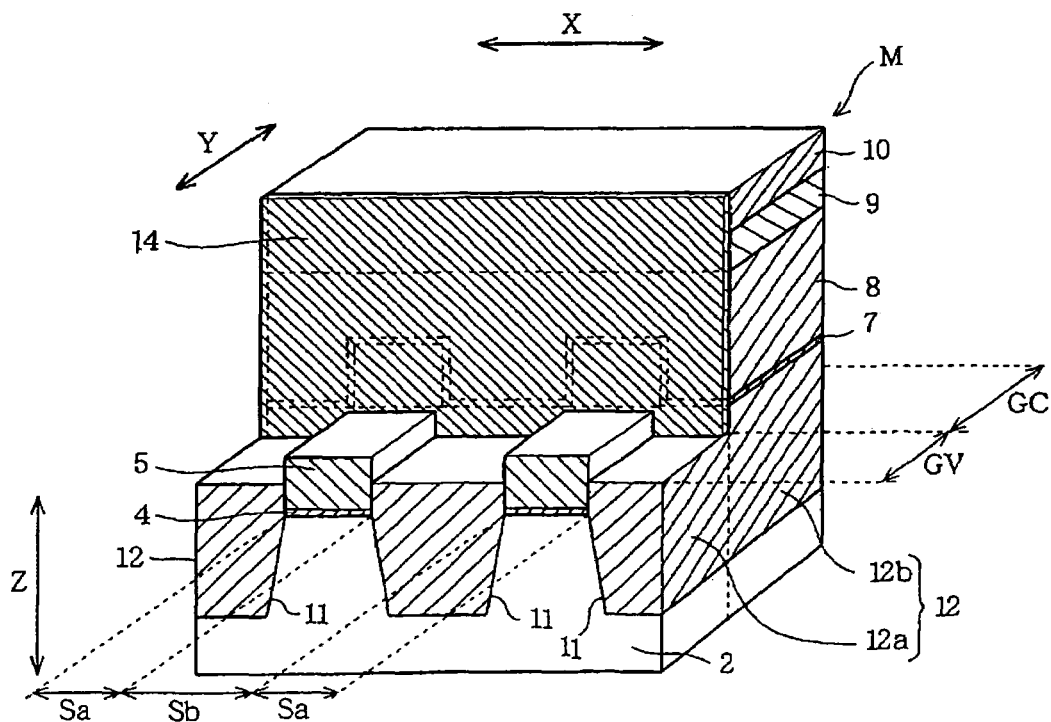
Figures 14A, 14B, 14C:
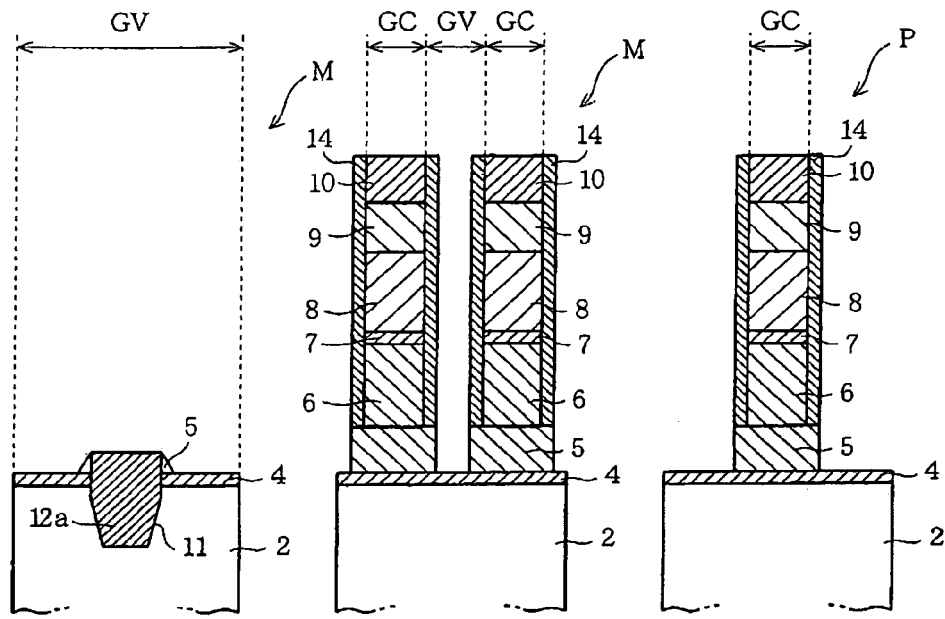
FIGS. 14A to 14D are views similar to FIGS. 4A to 4D, showing an eleventh step of the manufacturing process.
Figure 14D:
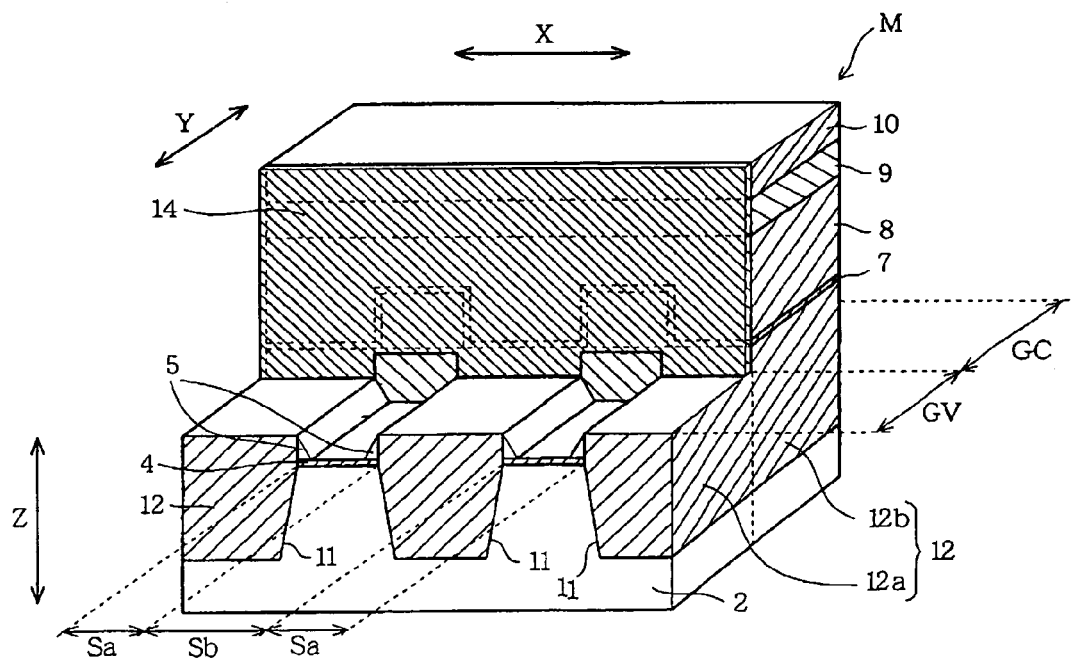

Referring to FIGS. 3A and 3B, a NAND flash memory 1 serving as a semiconductor device includes a semiconductor substrate 2 (see FIGS. 1A to 1D) on which a memory cell region M and a peripheral circuit region P are defined. Peripheral circuits (not shown) are formed in the peripheral circuit region P. Each peripheral circuit is provided for driving a corresponding one of memory cell arrays Ar formed in the memory cell region M.

Figure 2:
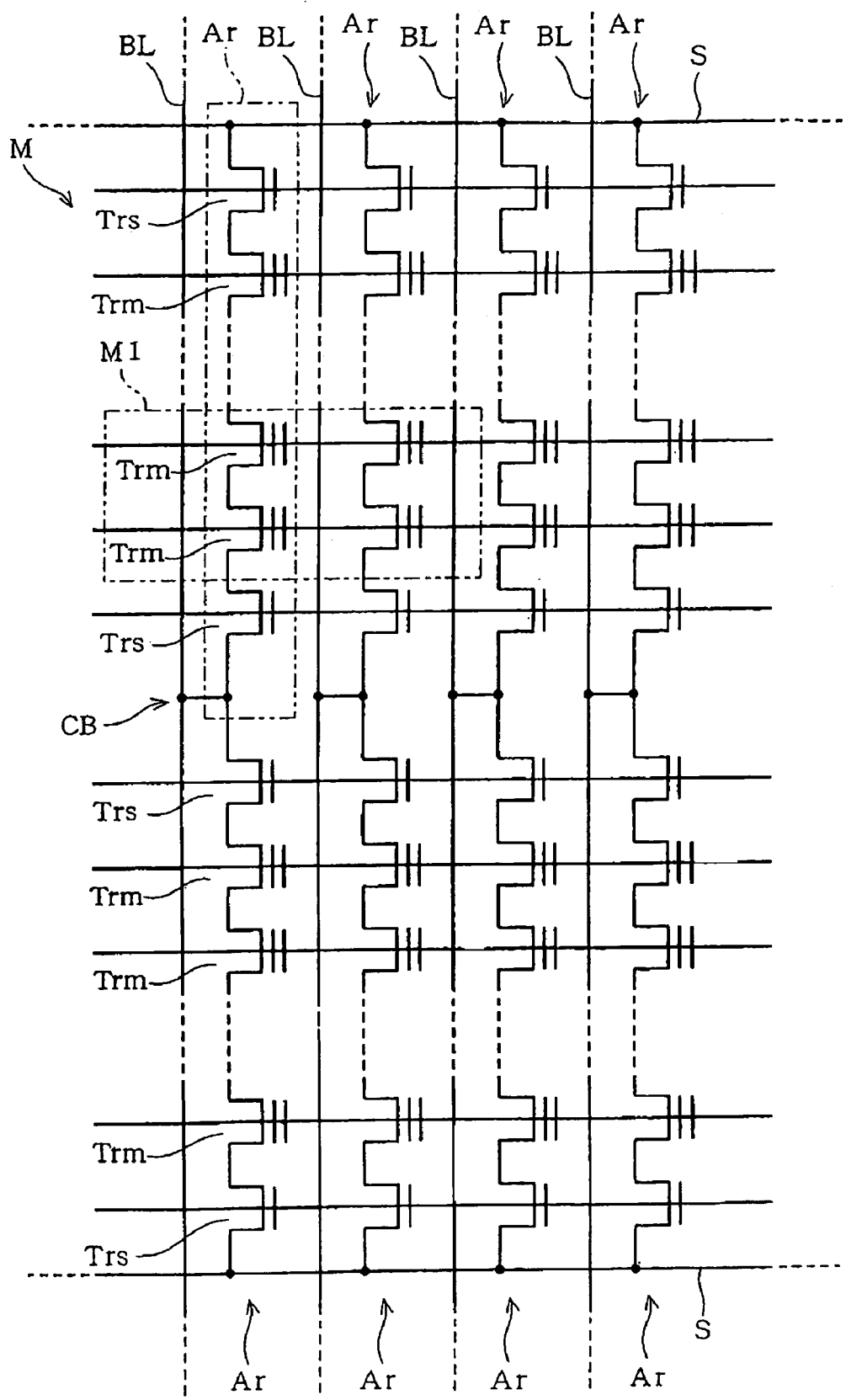
FIG. 2 illustrates an example of a circuit of a memory cell region.

Since a characteristic of the embodiment resides in the structure and manufacturing method of the memory cell region M, the memory cell region M will mainly be described. FIG. 2 illustrates an example of a circuit in the memory cell region M. A number of NAND-type memory cell arrays Ar are provided in the memory cell region M. Each memory cell array Ar is referred to as "NAND cell array." Each memory cell array Ar includes a plurality of selective gate transistors Trs formed at each of a bit line BL side and a source S side. Each memory cell array Ar further includes a plurality of memory cell transistors Trm (eight, sixteen; and 2' where n is a positive integer) serially connected between the selective gate transistors Trs. In the memory cell array M, the memory cell arrays Ar are arranged in the form of a matrix.

Figures 1A, 1B, 1C:
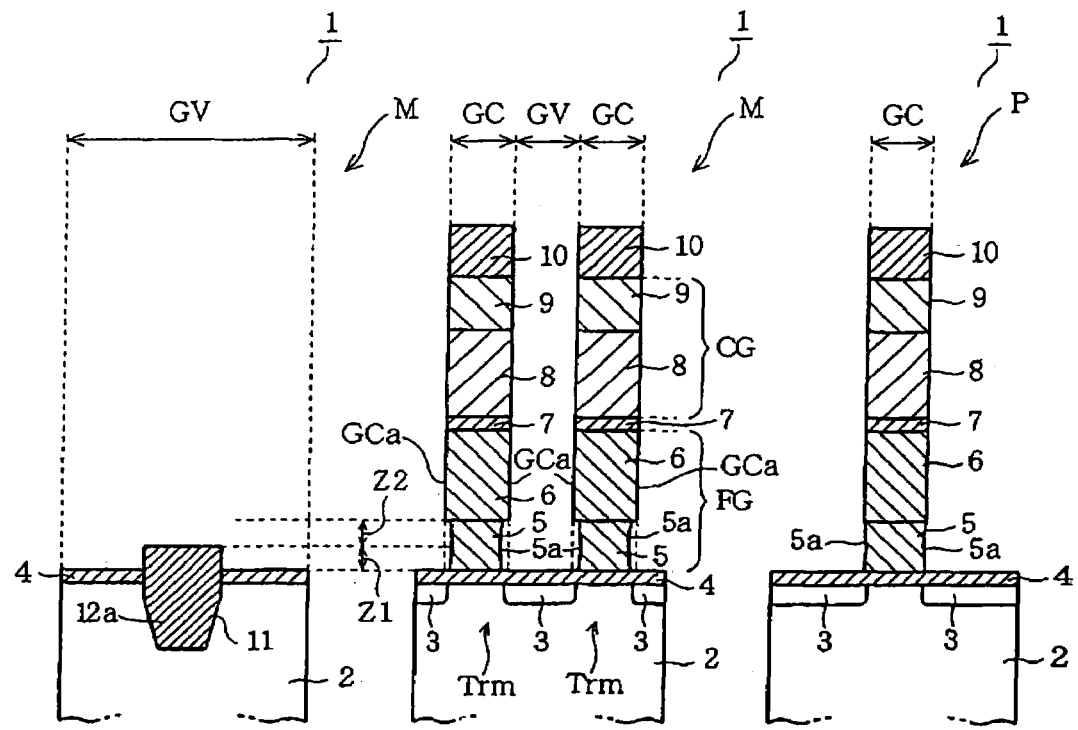
FIGS. 1A, 1B and 1C are schematic sectional views of a semiconductor device in accordance with one embodiment of the present invention, the views being taken along lines 1A-1A, 1B-1B and 1C-1C in FIGS. 3A, 3B and 3C, respectively.
Figure 1D:
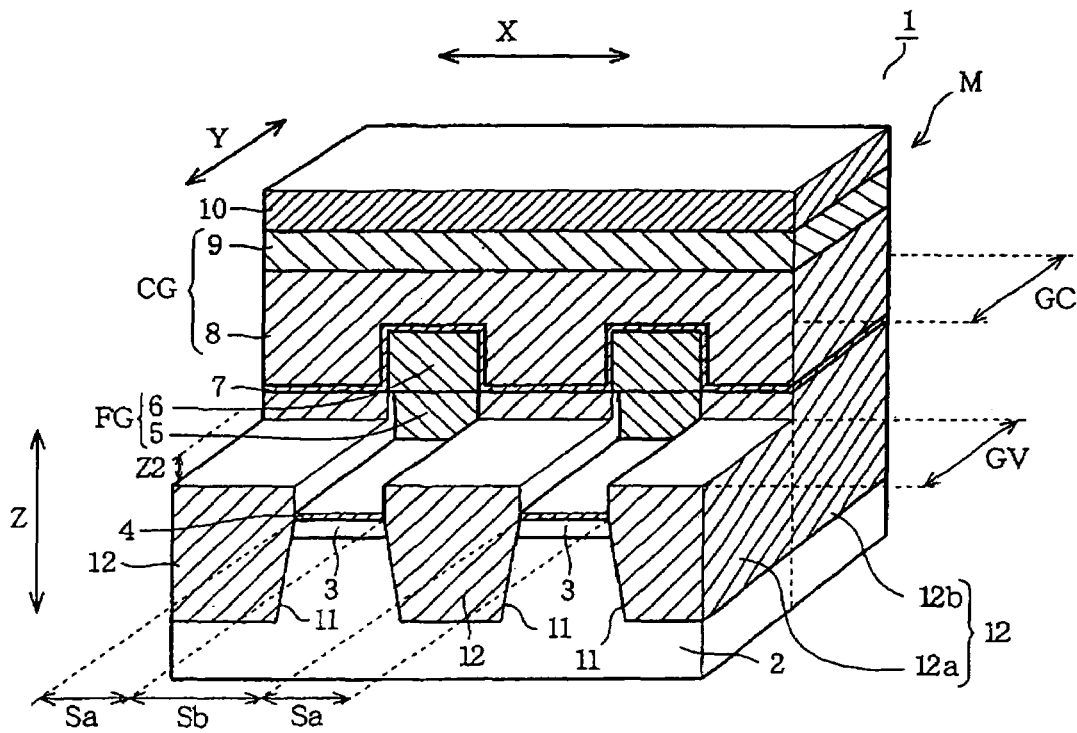
FIG. 1D is a perspective view schematically showing the structure of a gate electrode formation region and a gate electrode isolation region.

FIG. 3A schematically illustrates the structure of a part M1 of circuit constituting the memory cell region M of the NAND flash memory 1. FIG. 3B schematically illustrates a part of circuit in the peripheral circuit region P of the NAND flash memory 1. FIGS. 1A, 1B and 1C are schematic sectional views of a semiconductor device in accordance with one embodiment of the present invention, the views being taken along lines 1A-1A, 1B-1B and 1C-1C in FIGS. 3A, 3B and 3C, respectively. FIG. 1D is a perspective view schematically showing the structure of a gate electrode formation region GC in which gate electrodes are constituted and a gate electrode isolation region GV for isolating the gate electrodes.

In FIGS. 3A and 3B, reference symbol "AA" designates an active area. In FIGS. 1D and 3A, axes X, Y and Z intersect perpendicularly to one another. The silicon substrate 2 has a principal surface corresponding to a plane in the directions of X and Y axes.

FIGS. 1A to 1D schematically illustrate the characteristic part of the embodiment. When the NAND flash memory 1 is completed, interlayer insulating films (not shown) are formed in the gate electrode isolation region GV between a plurality of neighboring gate electrode formation regions GC in the memory cell region M and around the gate electrode formation region GC of the peripheral circuit region P. However, the interlayer insulating films are eliminated for the sake of showing the characteristics of the embodiment. The memory cell region M is structured as shown in FIGS. 1A, 1B and 1D. The silicon substrate 2 serving as the semiconductor substrate is formed so as to extend in a predetermined direction in FIG. 1D (Y-axis direction). A plurality of element isolation regions Sb are disposed at predetermined intervals in a direction perpendicular to the Y-axis direction (X-axis direction). A plurality of element formation regions Sa are defined by the element isolation regions Sb and disposed at predetermined intervals in the Y-axis direction in FIG. 1D.

On the element formation regions Sa are provided a gate oxide film 4 (corresponding to a first insulating film) serving as a gate insulating film, a floating gate electrode FG, an oxide-nitride-oxide (ONO) film 7 (corresponding to a third insulating film, interpoly insulating film and integrate insulating film), and a control gate electrode CG. Furthermore, a source/drain diffusion layer 3 (source/drain region) is formed in the element formation region Sa. The source/drain diffusion layer 3 is located at opposite sides of the floating gate electrode FG with respect to the Y direction on the upper surface side of the silicon substrate 2. The memory cell transistor Trm is composed of the gate oxide film 4, the floating gate electrode FG (corresponding to an electrode layer), the ONO film 7, the control gate electrode CG and the source/drain diffusion layer 3.

The control gate electrodes CG are consecutively formed so as to extend over the floating gate electrodes FG in the X direction in FIG. 1D (corresponding to the direction of intersection). Each active area AA includes the source/drain diffusion layer 3 and a channel region of the memory cell transistor Trm both formed in the element formation region Sa. Each source/drain diffusion layer 3 is formed so as to be common to neighboring memory cell transistors Trm, as shown in FIG. 1D. In other words, the memory cell arrays Ar of the NAND flash memory 1 are formed in the Y direction.

Now, a more specific film structure will be described. The gate electrode formation region GC of each element formation region Sa is formed as follows. On the silicon substrate 2 are sequentially deposited a gate oxide film 4 (corresponding to a first insulating film and a gate insulating film) comprised of a silicon oxide film, a first polycrystalline silicon layer 5 undoped with impurities (corresponding to a conductive layer) a second polycrystalline silicon layer 6 doped with an n-type impurity such as phosphor (corresponding to a conductive layer) an ONO film 7 (corresponding to a third insulating film and an intergate insulating film), a third polycrystalline silicon layer 8 doped with impurities (corresponding to a conductive layer), a tungsten silicide film 9 which will be referred to as "WSi film" (corresponding to a low-resistivity metal film), and a silicon nitride film 10 (corresponding to a gate forming pattern).

The first and second polycrystalline silicon layers 5 and 6 are juxtaposed in the X direction in FIG. 1D on the element formation regions Sa with the gate oxide film 4 being interposed therebetween, constituting each floating gate electrode FG. Each floating gate electrode FG may be made from a material other than the first and second polycrystalline silicon layers 5 and 6. The ONO film 7, the third polycrystalline silicon layer 8, the WSi film 9 and the silicon nitride film CG are formed so as to extend over the first and second polycrystalline silicon layers 5 and 6 in the X direction. The ONO film is one type of composite insulators including a silicon nitride film and a silicon oxide film. An alumite or other material may be used, instead of the ONO film 7.

The third polycrystalline silicon layer 8 and the WSi film 9 function as a control gate electrode CG. It is desirable that each of the third polycrystalline silicon layer 8 and the WSi film 9 should have lower resistivity than the floating gate electrode FG. Another silicide film may be employed, instead of the WSi film 9. The silicon nitride film 10 is formed on the WSi film 9 and functions as gate cap film. A silicon oxide film may be used, instead of the silicon nitride film 10.

A gate electrode isolation region GV is provided for isolating each of the aforementioned control gate electrode CG and floating gate electrode FG thereby to be divided into a plurality of parts in the Y direction. Thus, the gate electrode isolation region GV denotes a region obtained by removing from the structure of the gate electrode formation region CG the first and second polycrystalline silicon layers 5 and 6, ONO film 7 and third polycrystalline silicon layer 8, WSi film 9 and silicon nitride film 10.

In the gate electrode isolation region GV, the gate oxide film 4 is formed in the element formation region Sa on the silicon substrate 2. The interlayer insulating film (not shown) is formed on the gate oxide film 4. Accordingly, the control gate electrodes CG neighboring in the Y direction in FIG. 1D can be maintained in an electrically high resistant state, and the floating gate electrodes FG neighboring in the Y direction can also be maintained in a high resistant state. Furthermore, the source/drain diffusion layer 3 is formed at the surface layer side of the silicon substrate 2 in the element formation region Sa. Accordingly, each memory cell transistor Trm is comprised of the floating gate electrode FG, control gate electrode CG, gate oxide film 4 and source/drain diffusion layer 3 so as to extend in the Y direction.

Each element isolation region Sb in the memory cell region M is arranged as follows. An element isolation trench 11 is formed in the principal surface of the silicon substrate 2 so as to extend in a predetermined direction (Y direction in FIG. 1D) and have a predetermined depth. An element insulating film 12 (corresponding to a second insulating film) is formed inside the trench 11. The element insulating film 12 is comprised of a tetraethyl orthosilicate (TEOS) film and includes a first electrode isolation portion 12a formed in the gate electrode isolation region GV and a second electrode isolation portion 12b formed below the control gate electrode CG in the gate electrode formation region GC.

The element insulating film 12 has an upper surface located higher than upper surfaces of the neighboring gate oxide films 4 which are formed on the silicon substrate 2 so as to be located at both sides of the element insulating film 12, as shown in FIGS. 1A and 1D. That is, the upper part of the element isolation insulating film 12 protrudes upward from the principal surface of the silicon substrate 2. The element insulating film 12 is formed so that the upper surface thereof is located lower than an upper surface of the second polycrystalline silicon layer 6 formed in the element formation region Sa (for example, an upper surface of the first polycrystalline silicon layer 5). The first and second electrode isolation portions 12a and 12b are formed so that the upper surface of the first electrode isolation portion 12a is located lower than the upper surface of the second electrode isolation portion 12b. More specifically, as shown in FIGS. 1A and 1B, the upper surface of the first electrode isolation portion 12a is located higher than the upper surface of the gate oxide film 4 by Z1 (40 nm, for example). Furthermore, the upper surface of the first electrode isolation portion 12a is located lower than the upper surface of the second electrode isolation portion 12b by Z2.

The ONO film 7 is formed on the second electrode isolation section 12b in the gate electrode formation region GC which is located in the element isolation region Sb of the memory cell region M. More specifically, as shown in FIG. 1D, the second electrode isolation portion 12b and ONO film 7 are formed so as to cover the first polycrystalline silicon layer 5 and an overall upper surface and parts of the sidewalls of the second polycrystalline silicon layer 6. The second electrode isolation portion 12b and ONO film 7 maintains the first and second polycrystalline silicon layers 5 and 6 in an electrically high resistant state against the neighboring layers 5 and 6.

The third polycrystalline silicon layer 8, WSi film 9 and silicon nitride film 10 are deposited sequentially on the ONO film 7. The second polycrystalline silicon layer 6, ONO film 7, third polycrystalline silicon layer 8, WSi film 9 and silicon nitride film 10 have respective side ends GCa coplanar with one another. Accordingly, the second polycrystalline silicon layer 6, ONO film 7, third polycrystalline silicon layer 8, WSi film 9 and silicon nitride film 10 have the same width with respect to the Y direction. As shown in FIG. 1B, the first polycrystalline silicon layer 5 has a width which is smaller than the abovementioned same width and is formed into a contracted shape, for example.

Manufacturing Method

The following describes a method of manufacturing the gate electrodes in the memory cell region M of the NAND nonvolatile memory according to the embodiment of the invention. The method of the embodiment is applied to a gate preforming process in which a floating gate electrode is formed in advance of formation of an element isolation region Sb. On condition that the manufacturing method in accordance with the invention can be realized, one or more of the steps which will be described later may be eliminated and/or one or more ordinary steps may be added.

Manufacturing Process Carried Out Before the Structure Shown in FIGS. 7A to 7D is Achieved:

Since the method of the embodiment is characterized by a step of isolating the gates neighboring in the Y direction in FIGS. 7A to 7D, the manufacturing process carried out before the structure shown in FIGS. 7A to 7D is achieved will be described in brief.

A thermal oxidation process is applied to the silicon substrate 2 so that the gate oxidation film 4 is formed on the principal surface of the silicon substrate 2, as shown in FIGS. 4A to 4D. Subsequently, the polycrystalline silicon layer 5 undoped with an impurity such as phosphor or the like is formed on the gate oxidation film 4. Next, the second polycrystalline silicon layer 6 doped with an impurity such as phosphor or the like is formed on the first polycrystalline silicon film 5. Subsequently, the silicon nitride film (not shown) is formed on the second polycrystalline silicon layer 6 so as to serve as a stopper film for the chemical mechanical polish (CMP) process. Resist (not shown) is then applied onto the silicon nitride film and patterned. The silicon nitride film serving as the stopper film, second polycrystalline silicon layer 5, gate oxide film 4, and silicon substrate 2 are removed by the reactive ion etching (RIE) process, so that the element isolation trenches 11 extending in the Y direction are formed as shown in FIGS. 5A to 5D.

Subsequently, the element isolation insulating film 12 is formed substantially over the entire surface of the silicon substrate 2, whereby the element isolation insulating film 12 is buried in the element isolation trenches 11. Next, the upper surface of the element isolation film is planarized by the CMP process with the silicon nitride film serving as a stopper. The element isolation insulating film 12 is then removed so that a surface of the film 12 is located at a position lower than the upper surface of the second polycrystalline silicon layer 5 and higher than the upper surface of the gate oxide film 4, as shown in FIGS. 5A to 5D. Particularly in the embodiment, the element isolation insulating film 12 is removed until an interface between the first and second polycrystalline silicon layers 5 and 6 is reached. The upper surface of the element isolation insulating film 12 does not always correspond with the interface between the first and second polycrystalline silicon layers 5 and 6. The silicon nitride film formed as the stopper is then removed.

Subsequently, the ONO film 7 is isotropically formed on the processed structure as shown in FIGS. 6A to 6D. In this case, as shown in FIG. 6A, the ONO film 7 is formed so as to the entire upper surface and a part of the side of the second polycrystalline silicon layer 6. The ONO film 7 is further formed on the element isolation insulating film 12. The third polycrystalline silicon layer 8 is formed on the ONO film 7. The WSi film 9 is then formed on the third polycrystalline silicon layer 8. The silicon nitride film 10 is formed on the WSi film 9. The resist 13 is applied to the silicon nitride film 10 and patterned. The region where the pattern is formed belongs to the gate electrode formation region GC as shown in FIGS. 7B and 7D. The resist 13 is patterned in the X direction on the silicon nitride film 10. The silicon nitride film 10 and/or the resist 13 is formed as a gate forming pattern.

The silicon nitride film 10 is etched with the patterned resist 13 serving as the mask so as to be removed from the gate electrode isolation region GV and remain in the gate electrode formation region GC. Consequently, the structure as shown in FIGS. 7A to 7D is completed.

Subsequently, as shown in FIGS. 8A to 8D, the WSi film 9 is etched with the resist 13 serving as a mask, whereby the WSi film 9 formed in the gate electrode isolation region GV is removed. As a result, the WSi film 9 remains in the gate electrode formation region GC. Before the etching with the use of the patterned resist 13, the resist 13 may be removed and the silicon nitride film 10 may be used as the mask.

Subsequently, as shown in FIGS. 9A to 9D, the third polycrystalline silicon layer 8 is etched with the resist 13 serving as a mask, whereby the third polycrystalline silicon layer 8 is removed from the gate electrode isolation region GV. As the result of the processing, the third polycrystalline silicon layer 8 can be caused to remain in the gate electrode formation region GC. Consequently, the control gate electrodes CG neighboring in the Y direction (the third polycrystalline silicon layer 8 and WSi film 9) can structurally be divided.

Subsequently, as shown in FIGS. 10A to 10D, the ONO film 7 is etched with the resist 13 serving as a mask so that the ONO film is removed from the gate electrode isolation region GV. The etching condition can be adjusted so that the ONO film 7 is removed from the gate electrode isolation region GV as described above and so that the second and third polycrystalline silicon layers 6 and 8 are removed in the gate electrode isolation region GV. In this case, the second polycrystalline silicon layer 6 in the gate electrode isolation region GV can be removed until an interface between the first and second polycrystalline silicon layers 5 and 6 is nearly reached.

Subsequently, as shown in FIGS. 11A to 11D, an upper part (upper part of the first electrode isolation portion 12a) of the element isolation insulating film 12 formed in the gate electrode isolation region GV is etched. In this case, the upper part of the first electrode isolation portion 12a is removed on condition that the upper part of the first electrode isolation portion 12a has a higher selectivity than the first polycrystalline silicon layer 5. Then, the upper surface of the first electrode isolation portion 12a can be formed so as to be located lower than the upper part of the second electrode isolation portion 12b. Thus, the reason for removal of the upper part of the first electrode isolation portion 12a is that the first polycrystalline silicon layer 5 formed in the gate electrode isolation region is hard to remove.

Subsequently, as shown in FIGS. 12A to 12D, a protecting film 14 is isotropically formed on the whole surface after removal of the resist 13. The protecting film 14 is comprised of a boron-silicate glass (BSG), for example and has an optional film thickness.

Subsequently, as shown in FIGS. 13A to 13D, the protecting film 14 formed on the silicon nitride film 10 and the first polycrystalline silicon layer 5 in the gate electrode isolation region GV by an anisotropic etching process (the RIE process, for example). Then, the protecting film 14 remains so as to protect the sidewalls (side faces) of the second polycrystalline silicon layer 6, ONO film 7, third polycrystalline silicon layer 8, WSi film 9 and silicon nitride film 10.

Subsequently, as shown in FIGS. 14A to 14D, the first polycrystalline silicon layer 5 formed in the gate electrode isolation region GV is removed by the anisotropic etching process (the RIE process, for example). Then, the upper surface of the first electrode isolation portion 12a of the element isolation insulating film 12 and the upper surface of the gate oxide film 4 are partially exposed, whereas the first polycrystalline silicon layer 5 remains under the second polycrystalline silicon layer 6 of the gate electrode formation region GC, as shown in FIGS. 14A to 14D. Furthermore, the first polycrystalline silicon layer 5 remains beneath the protecting film 14 so as to extend along the outer surface of the protecting film 14. Furthermore, the upper surface of the first electrode isolation portion 12a is located higher than the upper surface of the gate oxide film 4.

Accordingly, the first polycrystalline silicon layer 5 remains along the sidewalls of the first electrode isolation portion 12a.

When the first polycrystalline silicon layer 5 remains along the sidewalls of the first electrode isolation portion 12a, electric current is allowed to flow between the first polycrystalline silicon layers 5 between the neighboring gate electrode formation regions GC after completion of the device. This would constitute a cause for failure. Furthermore, when the gate oxide film 4 is etched on condition with high anisotropy (the RIE process, for example), the gate oxide film 4 would sometimes reduce the reliability as the gate insulating film. Accordingly, it should be avoided to etch the first polycrystalline silicon layer 5 remaining on the sidewalls of the first electrode isolation portion 12a on condition with such a high anisotropy that the remaining first polycrystalline silicon layer 5 is completely removed.

Subsequently, as shown in FIGS. 15A to 15D, the first polycrystalline silicon layer 5 remaining on the sidewalls of the first electrode isolation portion 12a is isotropically etched on condition that the first polycrystalline silicon layer 5 has a higher selectivity than the gate oxide film 4 and the element isolation insulating film 12. In this case, the etching process is carried out by the RIE process with power reduced as compared with the aforesaid condition of high anisotropy or a chemical dry etching (CDE) process is employed. Thus, it is desirable that an anisotropic etching process (by the RIE process) should be carried out for the second polycrystalline silicon layer 6 at first and thereafter, an isotropic etching process should be carried out for the second polycrystalline silicon layer 6. This process can be applied to a gate processing in which dimensional control is important. Consequently, the first polycrystalline silicon layer 5 formed on the sidewalls of the first electrode isolation portion 12a can be removed almost completely, and adverse effects on the gate oxide film 4 can be suppressed as much as possible.

The upper surface of the first electrode isolation portion 12a is formed so as to be located higher than the upper surface of the gate oxide film 4 when the first polycrystalline silicon layer 5 is etched. Accordingly, the silicon substrate 2 is prevented from adverse effects of the etching process which have been given to the silicon substrate 2 through the vicinity of the interface between the first electrode isolation portion 12a and the gate oxide film 4. Consequently, adverse effects on the vicinity of the surface of the silicon substrate 2 can be suppressed as much as possible.

Figures 15A, 15B, 15C:
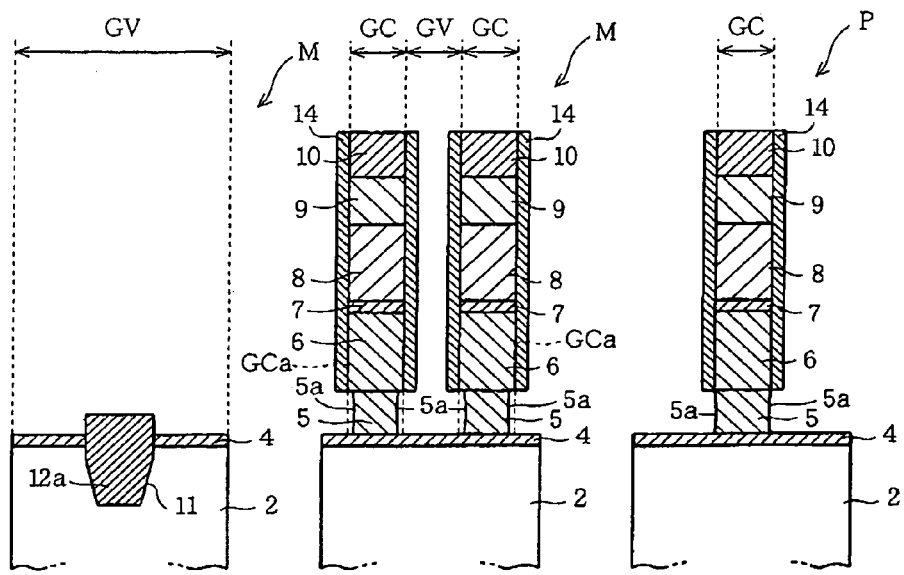
FIGS. 15A to 15D are views similar to FIGS. 4A to 4D, showing a twelfth step of the manufacturing process.
Figure 15D:
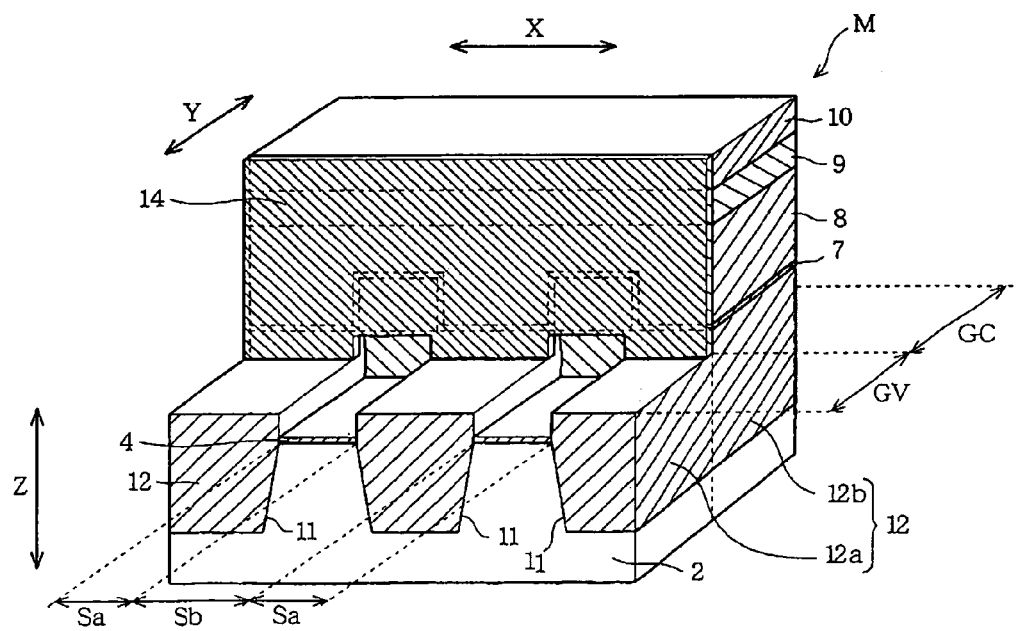

Furthermore, as shown in FIG. 15B, the sidewalls 5a (sides) of the first polycrystalline silicon layer 5 on the gate electrode formation region GC are removed so as to be located inside the gate electrode formation region GC relative to the side faces GCa of the second polycrystalline silicon layer 6. As a result, the first polycrystalline silicon layer 5 is formed to be narrower as compared with the second polycrystalline silicon layer 6. However, the protecting films 14 are formed on the sidewalls of the silicon nitride film 10, WSi film 9, third polycrystalline silicon layer 8, ONO film 7, second polycrystalline silicon layer 6. Accordingly, the side faces GCa of the second and third polycrystalline silicon layers 6 and 8, ONO film 7, WSi film 9 and the silicon nitride film 10 can be protected during the etching of the first polycrystalline silicon layer 5 in the gate electrode formation region GC. Since the side faces GCa of the WSi film 9 is particularly protected, deterioration of the electric characteristics of the control gate electrode CG can be suppressed. The first and second polycrystalline silicon layers 5 and 6 can be configured into the floating gate through the above-described steps. The above-described processing is carried out in the same manner for the peripheral circuit region P.

Subsequently, as shown in FIGS. 1A to 1D, a wet etching process is carried out to remove the protecting films 14 formed on the sidewalls of the first to third polycrystalline silicon layers 5, 6 and 8, ONO film 7, WSi film 9 and silicon nitride film 1 and further reaction products produced during the etching process. Furthermore, the source/drain diffusion layer 3 is formed. Since subsequent steps are well known in the art, detailed description of these steps will be eliminated. The NAND flash memory 1 can be manufactured through a step of forming a spacer film (not shown), a step of forming an interlayer insulating film (not shown) and the like.

According to the manufacturing method of the embodiment, the protecting film 14 is formed to protect the sidewalls of the silicon nitride film 10, WSi film 9, third polycrystalline silicon layer 8, ONO film 7 and second polycrystalline silicon layer 6 all formed in the gate electrode formation region GC before the step of removing the first polycrystalline silicon layer 5 formed in the gate electrode isolation region GV. Accordingly, since the side faces GCa of the second and third polycrystalline silicon layers 6 and 8, ONO film 7, WSi film 9 and silicon nitride film 10 are protected, deterioration of electrical characteristics of the control gate electrode CG can be suppressed.

The RIE process is carried out when the first polycrystalline silicon layer 5 is firstly removed. Thus, the manufacturing method of the embodiment can be applied to gate processing in which dimensional control is more important.

The first polycrystalline silicon layer 5 is etched by the RIE process on the condition that the first polycrystalline silicon layer 5 has a higher selectivity than the element isolation insulating film 12 and the gate oxide film 4 thereby to be removed. Thereafter, the first polycrystalline silicon layer 5 is further etched by the CDE process on the condition that the first polycrystalline silicon layer 5 has a higher selectivity than the element isolation insulating film 12 and the gate oxide film 4 thereby to be removed. Consequently, a high-level performance of the device can be maintained.

The first polycrystalline silicon layer 5 formed in the gate electrode isolation region GV is removed by the anisotropic etching and thereafter, the isotropic etching is also carried out. Consequently, the first polycrystalline silicon layer 5 remaining on the sidewalls of the first electrode isolation portion 12a can easily be removed. Moreover, since the first polycrystalline silicon layer 5 is removed to the inside of the gate electrode formation region GC, the possibility of electrical connection between neighboring floating gate electrodes FG can be suppressed as much as possible.

The invention should not be limited to the foregoing embodiment, but the embodiment may be modified or expanded as follows. In the foregoing embodiment, the second polycrystalline silicon layer 6 in the gate electrode isolation region GV is removed to the interface between the first and second polycrystalline silicon layers 5 and 6 as shown in FIGS. 10A to 10D. However, the invention should not be limited to this removing manner. The etching condition may be adjusted so that the upper part of the first polycrystalline silicon layer 5 in the gate electrode isolation region GV is also removed, or a lower part of the second polycrystalline silicon layer 6 may remain.

In the foregoing embodiment, the first polycrystalline silicon layer 5 is processed by the anisotropic etching (the etching process on the condition with higher degree of anisotropy) and thereafter by the isotropic etching (the etching process on the condition with higher degree of isotropy). The etching manner should not be limited to the foregoing. For example, the isotropic etching may be carried out without execution of the anisotropic etching.

In the foregoing embodiment, the first polycrystalline silicon layer 5 is removed to the inside of the gate electrode formation region GC. However, the first and second polycrystalline silicon layers 5 and 6 may be removed so that the neighboring floating gate electrodes FG are divided.

The element isolation trench 11 is formed in the direction of Y-axis and the gate electrode isolation region GV is formed in the direction of X-axis perpendicular to the Y-axis on the principal surface of the silicon substrate 2. The direction of the element isolation trench 11 and the direction of the gate electrode isolation region GV may only intersect each other and an angle of intersection should not be limited.

The invention is applied to the NAND flash memory in the foregoing embodiment. However, the invention should not be limited to the NAND flash memory. For example, the invention may be applied to an electronically erasable and programmable read only memory (EEPROM), erasable programmable read only memory (EPROM) or NOR flash memory, instead. Furthermore, the invention may be applied to other non-volatile semiconductor memories, other semiconductor memories or other semiconductor devices.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of manufacturing a semiconductor device, comprising:

forming a first insulating film on a semiconductor substrate;

forming an electrode layer on the first insulating film;

forming a second insulating film in the semiconductor substrate so that the second insulating film extends in a predetermined direction;

forming a third insulating film, a conductive layer and a low-resistivity metal film sequentially so that the second insulating film and the electrode layer are covered by the third insulating film, the conductive layer and the low-resistivity metal film;

forming a gate forming pattern on the low-resistivity metal film so that the gate forming pattern corresponds to a plurality of gate electrode formation regions extending in a direction perpendicular to a predetermined direction on the principal surface of the semiconductor substrate;

removing the low-resistivity metal film, the conductive layer, the third insulating film and an upper part of the electrode layer in a gate electrode isolation region interposed between the neighboring gate electrode formation regions with the gate forming pattern serving as a mask;

forming a protecting film so that the protecting film covers the low-resistivity metal film, the conductive layer, the third insulating film and an upper surface of the electrode layer all exposed as a result of execution of the removing step;

removing the protecting film formed on the upper surface of the electrode layer located on the upper surface of the electrode layer in the gate electrode isolation region;

removing the electrode layer in the gate electrode isolation region, the electrode layer being exposed as a result of execution of the protecting film removing step; and removing residue of the protecting film.

2. The method according to claim 1, wherein in the electrode layer removing step, an anisotropic etching process is carried out at first and thereafter, an isotropic etching process is carried out.

3. The method according to claim 1, wherein in the electrode layer removing step, the electrode layer in the gate electrode isolation region is etched by an RIE process on a condition that the electrode layer has a higher selectivity than the first and second insulating films, and thereafter, the electrode layer is etched by a CDE process on a condition that the electrode layer has a higher selectivity than the first and second insulating films.

4. The method according to claim 2, wherein in the electrode layer removing step, the electrode layer in the gate electrode isolation region is etched by an RIE process on a condition that the electrode layer has a higher selectivity than the first and second insulating films, and thereafter, the electrode layer is etched by a CDE process on a condition that the electrode layer has a higher selectivity than the first and second insulating films.

* * * * *